(12) United States Patent
Kurihara

(10) Patent No.: US 6,204,471 B1
(45) Date of Patent: Mar. 20, 2001

(54) PARTS SOLDERING APPARATUS AND METHOD

(75) Inventor: Mitsuru Kurihara, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/249,322

(22) Filed: Feb. 12, 1999

(30) Foreign Application Priority Data

Feb. 13, 1998 (JP) .................................................. 10-031852

(51) Int. Cl.$^7$ .............................. B23K 1/005; B23K 3/00
(52) U.S. Cl. .................................. 219/121.62; 219/85.12; 228/6.2; 228/12
(58) Field of Search ............................. 219/85.12, 85.13, 219/121.62, 121.63, 121.64, 121.83; 228/6.2, 12

(56) References Cited

U.S. PATENT DOCUMENTS

| | | | |
|---|---|---|---|
| 4,278,867 | * 7/1981 | Tan ................................... | 219/121.64 |
| 4,858,308 | 8/1989 | Komori . | |
| 5,018,936 | * 5/1991 | Izumi et al. ................. | 219/121.83 X |
| 5,023,426 | 6/1991 | Prokosch et al. . | |
| 5,250,781 | * 10/1993 | Kanda et al. ................... | 219/121.63 |
| 5,591,295 | 1/1997 | Onitsuka . | |
| 5,956,607 | * 9/1999 | Evers .......................... | 219/121.63 X |

FOREIGN PATENT DOCUMENTS

| | | |
|---|---|---|
| 0 430 861 A1 | 11/1990 | (EP) . |
| 62-67894 | 3/1987 | (JP) . |
| 62-134173 | * 6/1987 | (JP) . |
| 64-1233 | 1/1989 | (JP) . |
| 2-232999 | * 9/1990 | (JP) . |
| 4-247700 | 9/1992 | (JP) . |
| 6-268028 | 9/1994 | (JP) . |

OTHER PUBLICATIONS

European Search dated Aug. 11, 2000.
Japanese Office Action dated Feb. 8, 2000 with partial translation.

* cited by examiner

Primary Examiner—Samuel M. Heinrich
(74) Attorney, Agent, or Firm—McGinn & Gibb, PLLC

(57) ABSTRACT

To provide parts soldering apparatus and method which improve the productivity during parts soldering and increase the mounting accuracy of parts on a circuit board. The parts soldering apparatus of the present invention has: a stage for positioning a circuit board whereon, the circuit board is mounted a solder tip whereon; a loading arm made of a light-transmitting material, for loading a part onto the solder tip; a fluctuating mechanism for pressing the loading arm toward the circuit board; and an optical source for irradiating light onto the part through the loading arm and for melting the solder tip by the conductive heat of the light irradiated onto the part.

6 Claims, 11 Drawing Sheets

PARTS SOLDERING APPARATUS AND METHOD

FIELD OF THE INVENTION

The present invention relates to parts soldering apparatus and method for soldering surface mounting type electronic parts on a circuit board.

DESCRIPTION OF PRIOR ART

In recent years, along with the downsizing of electronic circuit and high-density mounting of parts, a surface mounting technology for soldering chip parts such as semiconductor devices onto the parts mounting surface of a circuit board has developed.

Conventionally, the chip parts soldering apparatus of this type for surface mounting has a stage for freely positioning a circuit board and a loading arm for loading a chip part on the circuit board on this stage through a solder tip.

With such a chip parts soldering apparatus, in order to solder the chip part on the parts mounting surface of the circuit board, the chip part is loaded on the parts mounting surface of the circuit board, which has been positioned on the stage in advance, through a solder tip. Then the stage or the loading arm is heated. Thus the solder tip between the chip part and the circuit board is heated to be melted.

Japanese Patent Application Laid-Open No. 6-268028 (published on Sep. 22, 1994) has disclosed a semiconductor device manufacturing method in which solder is heated to be melted by heating the stage. The method disclosed in the laid-open patent application will be described as a prior art.

FIG. 13 is a schematic view for illustrating a soldering process in a parts soldering apparatus for semiconductor devices as a prior art. Solder bumps 103 are formed on electrodes 102 of an electronic part 101. The solder bump 103 on the electrodes 102 of the electronic part 101 is aligned with electrodes 105 on a circuit board 104 placed on a heater 106 through a low-heat-conductivity member 107 for abutting the solder bumps 103 on the electrodes 102. Next, the heater 106 is heated, the solder bumps 103 are melted and the electrodes 102 are thermally compressed onto the circuit board 104.

As described above, in the conventional parts soldering apparatus, the stage or the loading arm is heated, and thereby the chip part is soldered.

However, the prior art has such problems that much time is required before the solder tip is melted. Thus the soldering speed is low and the productivity is low despite much electric power being consumed because soldering is performed by heating the stage or loading arm having a high heat capacity.

Also, the prior art has problems that the chip part floats by the surface tension of the melted solder when the solder tip is melted, moves in the horizontal direction, and shifts from the target mounting position. Therefore, the mounting accuracy of chip part on the circuit board is decreased, because the loading arm has only the function for merely loading the chip part on the circuit board.

Further, when a large number of chip parts are mounted on the circuit board by the solder reflow process etc., all of the chip parts are heated once in soldering. Therefore, it is necessary to remove in advance an oxide film on the solder tips before loading the parts by the scrubbing operation of the chip parts. Therefore, there arises such a problem that the mounting accuracy is further decreased.

An object of the present invention is to provide parts soldering apparatus and method which improve the productivity during parts soldering and increase the mounting accuracy of parts on a circuit board.

SUMMARY OF THE INVENTION

To realize the above object, a first feature of the parts soldering apparatus of the present invention having: a stage for positioning a circuit board whereon, the circuit board is mounted a solder tip whereon; a loading arm made of a light-transmitting material, for loading a part onto the solder tip; a fluctuating mechanism for pressing the loading arm toward the circuit board; and an optical source for irradiating light onto the part through the loading arm and for melting the solder tip by the conductive heat of the light irradiated onto the part.

A second feature of the parts soldering apparatus of the present invention further having: a fluctuating sensor for outputting a height detecting signal according to the height of the loading arm; and a controller for controlling the output power of the optical source in response to the height detecting signal from the fluctuating sensor.

A third feature of the parts soldering apparatus of the present invention is: the controller: turns on the optical source at a first output power during the time when the loading arm moves from the height at the time of loading of the part onto the solder tip to the height at the time of melting of the solder tip; turns on the optical source at a second output power lower than the first output power during the time when the loading arm moves from the height at the time of melting of the solder tip to the height at the time of solidified of the solder tip; and turns off the optical source after the loading arm has moved to the height of solidified of the solder tip.

A first feature of the parts soldering method of the present invention having the steps of: positioning a circuit board on a stage, the circuit board is mounted a solder tip whereon; loading a part onto the solder tip by a loading arm made of a light-transmitting material; and irradiating light onto the part through the loading arm with pressing the part toward the circuit board by the loading arm and melting the solder tip by the conductive heat of the light irradiated onto the part.

A second feature of the parts soldering method of the present invention is: the optical source is turned on at a first output power during the time when the loading arm moves from the height at the time of loading of the part onto the solder tip to the height at the time of melting of the solder tip; the optical source is turned on at a second output power lower than the first output power during the time when the loading arm moves from the height at the time of melting of the solder tip to the height at the time of solidified the solder tip; and the optical source is turned off after the loading arm has moved to the height of solidified the solder tip.

DETAILED DESCRIPTION OF THE PREFERRED EMBODIMENTS

Figure 1:
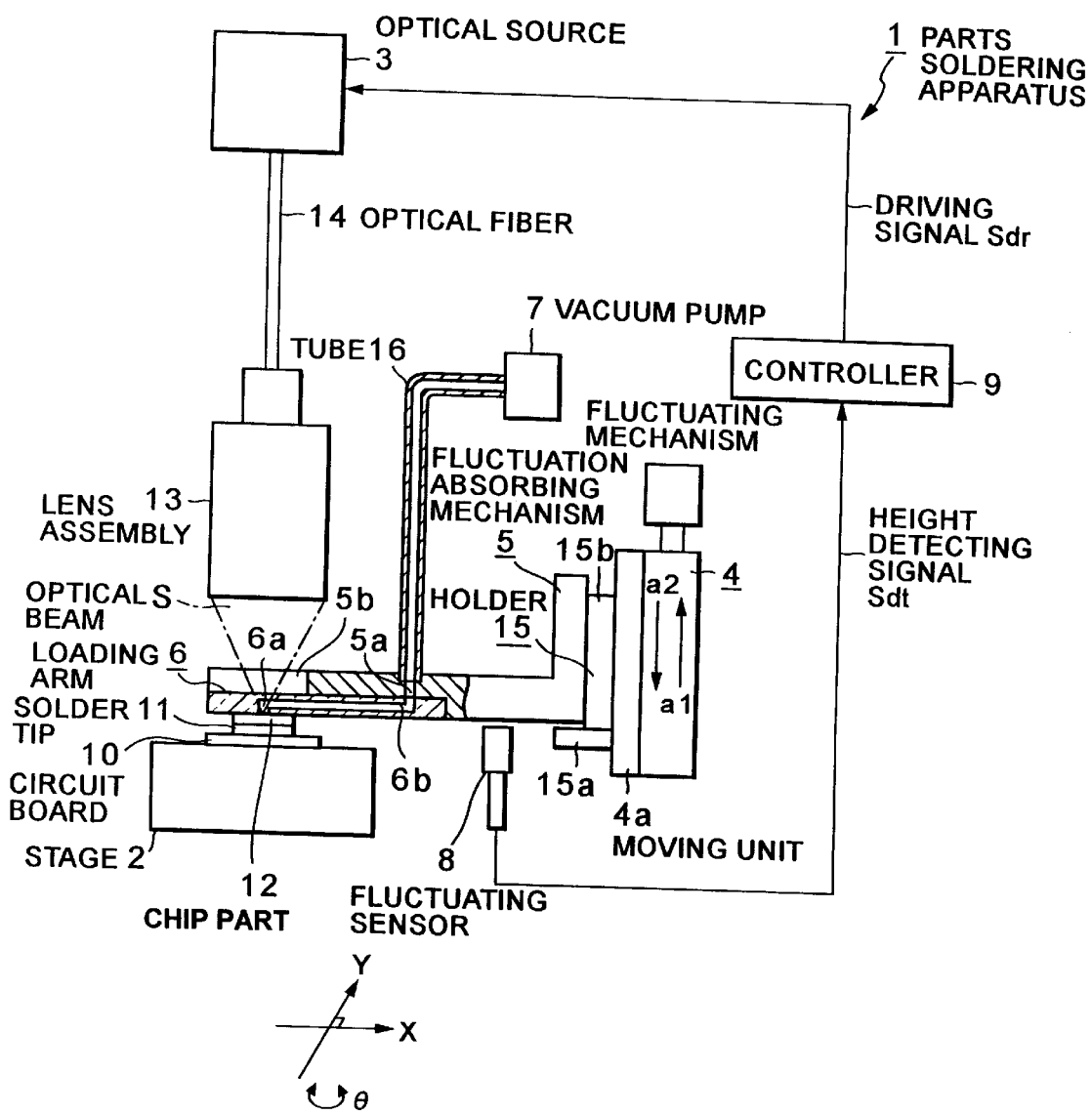
FIG. 1 is a partially broken front view showing a configuration of a parts soldering apparatus according to the first embodiment of the present invention.

FIG. 1 is a partially broken front view showing a configuration of a parts soldering apparatus according to the first embodiment of the present invention.

A parts soldering apparatus 1 consists of a stage 2, an optical source 3, a fluctuating mechanism 4, a fluctuation absorbing mechanism 5, a loading arm 6, a vacuum pump 7, a fluctuating sensor 8, a controller 9, a lens assembly 13, an optical fiber 14, a holder 15, and a tube 16.

The stage 2 consists of a preheated stage in which a heater is incorporated. The stage 2 is preheated to a temperature slightly lower than the melting temperature of a solder tip 11.

On the upper surface of the stage 2, a suction hole (not shown) is formed open, and this suction hole communicates with a vacuum pump (not shown).

A circuit board 10 is mounted on the stage 2. When the vacuum pump (not shown) is driven, the circuit board 10 is attracted and fixed to the stage 2.

Further, the stage 2 is driven by a stage driving device (not shown) so as to freely moves on the X-Y plane and freely rotate around the θ axis in FIG. 1, by which the circuit board 10 mounted on the stage 2 is aligned with the target position.

The optical source 3 is a xenon lamp emitting infrared rays etc. or the like lamp. The optical source 3 is provided at a distance above the stage 2. The optical source 3 is optically connected to the lens assembly 13 through the optical fiber 14. The light from the optical source 3 is irradiated onto one point on the stage 2 positioned below as an optical beam S through the optical fiber 14 and the lens assembly 13.

The fluctuating mechanism 4 has a feed mechanism such as a screw shaft rotated by a pulse motor or the like and a moving unit 4a which engages with the feed mechanism to be vertically moved by an arbitrary distance in the directions a1 and a2 as shown in FIG. 1. Further, the fluctuating mechanism 4 is rotated by an operating mechanism (not shown), in addition to the movement in the directions a1 and a2, so as to be capable of being moved onto a chip parts supplying device (not shown).

The holder 15 has a vertical portion 15b attached vertically and in parallel to the side surface of the moving unit 4a and a horizontal portion 15a formed projecting to the left side in FIG. 1 from the bottom surface of the vertical portion 15b.

The fluctuation absorbing mechanism 5 consists of an L-shaped rigid member. The fluctuation absorbing mechanism 5 abuts on the vertical portion 15b of the holder 15 in parallel so as to slide freely and vertically. The fluctuation absorbing mechanism 5 is mounted on the horizontal portion 15a of the holder 5 without being fixed. FIG. 1 shows a state in which the fluctuation absorbing mechanism 5 is raised by the solder tip 11 and a chip part 12. In this state, the fluctuation absorbing mechanism 5 is separated from the horizontal portion 15a of the holder 15. Specifically, since the fluctuation absorbing mechanism 5 merely rides on the horizontal portion 15a of the holder 15, even if the moving unit 4a and the holder 15 suddenly lower, a downward force is not applied to the fluctuation absorbing mechanism 5.

A flow path 5a is formed in the fluctuation absorbing mechanism 5. One end of the flow path 5a communicates with the vacuum pump 7 through a tube 16. At the tip end of the fluctuation absorbing mechanism 5 is formed a notch 5b for transmitting the optical beam S emitted from the optical source 3.

The loading arm 6 is a member formed of a transparent light-transmitting material such as quartz glass having high heat resistance and low thermal expansion. The loading arm 6 is detachably fixed on the lower side of the tip end portion of the fluctuation absorbing mechanism 5. Thereupon, the optical beam S emitted from the optical source 3 passes through the loading arm 6 and reaches onto the stage 2 as shown in FIG. 1.

Further, a suction hole 6a is formed open on the lower surface of the tip end portion of the loading arm 6, and a flow path 6b is formed in the loading arm 6. One end of the flow path 6b communicates with the suction hole 6a, and the other end thereof communicates with the flow path 5a of the fluctuation absorbing mechanism 5.

Thus, when the vacuum pump 7 is driven, the air pressure in the tube 16, flow path 5a, and flow path 6b decreases, so that the chip part 12 is attracted to the suction hole 6a opening on the lower surface of the tip end portion of the loading arm 6.

The fluctuating sensor 8 is a non-contact type sensor such as an eddy current type proximity sensor or the like sensor. The fluctuating sensor 8 is disposed under the lowest limit of vertical movement range of the fluctuation absorbing mechanism 5. The fluctuating sensor 8 outputs a height detecting signal Sdt according to the height of the loading arm 6.

The controller 9 supplies a driving signal Sdr to the optical source 3 in response to the height detecting signal Sdt provided from the fluctuating sensor 8 and controls the output power of the optical source 3, that is, the irradiation strength.

Figure 2:
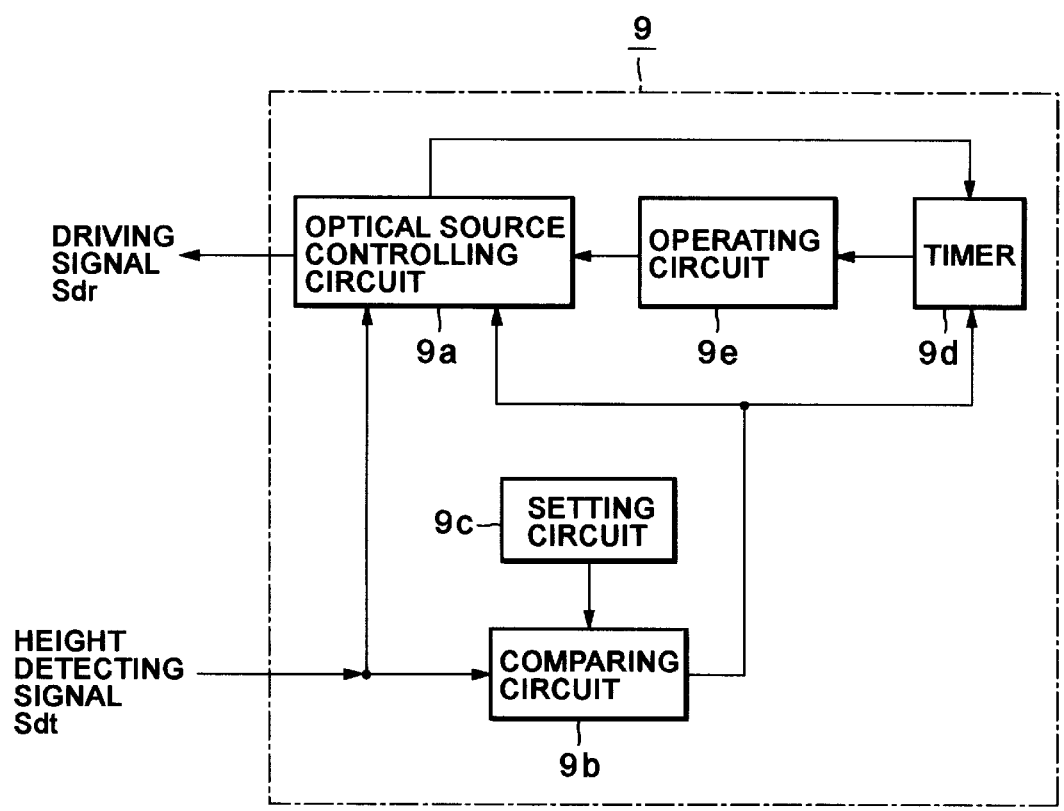
FIG. 2 is a block diagram of a controller in the FIG. 1 embodiment.

FIG. 2 is a block diagram of the controller according to the FIG. 1 embodiment.

The controller 9 has an optical source controlling circuit 9a, a comparing circuit 9b, a setting circuit 9c, a timer 9d, and an operating circuit 9e.

The optical source controlling circuit 9a controls the output power of the optical source 3 in response to the height detecting signal Sdt from the fluctuating sensor 8 and the signals from the comparing circuit 9b and the operating circuit 9e.

The comparing circuit 9b compares the height of the loading arm 6 represented by the height detecting signal Sdt from the fluctuating sensor 8 with the height set in advance in the setting circuit 9c, and outputs a signal according to the difference.

The timer 9d measures the light irradiation time of the optical source 3 in response to the signals supplied from the optical source controlling circuit 9a and the comparing circuit 9b, and outputs a signal to the operating circuit 9e.

The operating circuit 9e calculates the irradiation time after the melting of the solder tip 11 based on the standard required melting time information stored therein in advance, the standard irradiation time information after the solder tip 11 melt, and the measured required melting time information obtained from the output signal of the timer 9d, and outputs a signal to the optical source controlling circuit 9a.

The following is a description of a parts soldering method in accordance with the present invention.

Positioning and Fixing of the Stage

Figure 3:
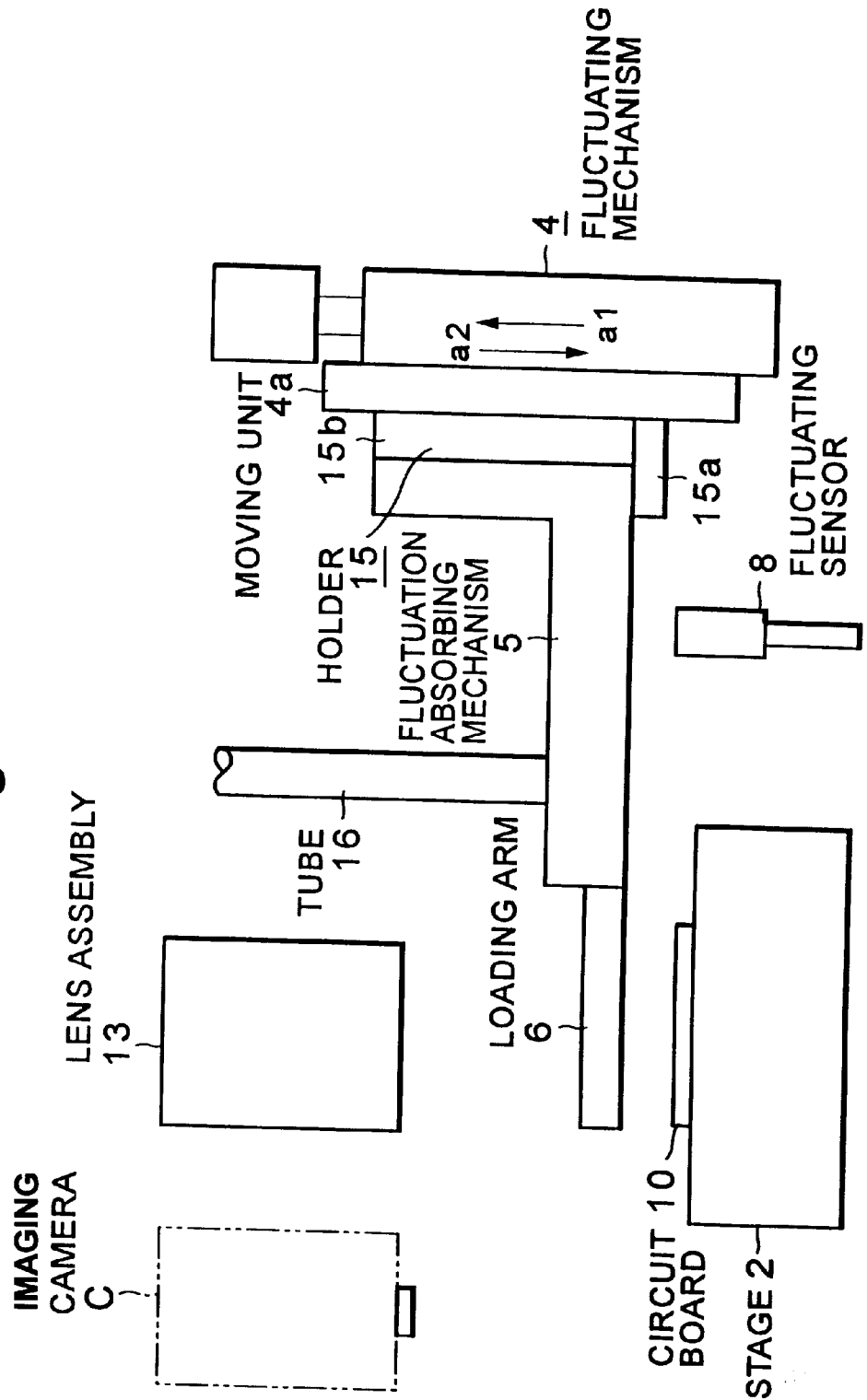
FIG. 3 is a partially broken front view showing a positioning state of a stage according to the FIG. 1 embodiment.

FIG. 3 is a partially broken front view showing a positioning state of the stage according to the FIG. 1 embodiment. The fluctuating mechanism 4 is driven to separate the loading arm 6 upward from the stage 2.

The lens assembly 13 is moved from the irradiation position indicated by the solid line in FIG. 3 to a non-irradiation position, and an imaging camera C indicated by the two-dot chain line in FIG. 3 is moved to the previous irradiation position of the lens assembly 13.

The circuit board 10 is mounted on the stage 2. The vacuum pump (not shown) is driven to attract the circuit board 10 to the suction hole (not shown) on the stage 2, whereby the circuit board 10 is fixed to the stage 2.

The circuit board 10 is photographed by the imaging camera C. The stage 2 is moved on the X-Y plane and rotated around the θ axis so that the target chip part mounting position on the circuit board 10 comes just under the imaging camera C, by which the circuit board 10 and the stage 2 are positioned at the target position and fixed there.

Placement of the Solder Tip

Next, the stage 2 is preheated to a temperature slightly lower than the melting temperature of the solder tip 11 by using the heater incorporated in the stage 2 or the like heating means, and the solder tip 11 is placed on the circuit board 10 positioned on the stage 2.

When the solder tip 11 is placed, the solder tip 11 may be placed on the circuit board 10 while being attracted to the suction hole 6a of the loading arm 6 by driving the vacuum pump 7, or may be placed by using other arbitrary means.

Loading of the Parts

Next, the loading arm 6 is moved onto a chip parts supplying device (not shown), and the chip part 12 is attracted to the suction hole 6a of the loading arm 6 by driving the vacuum pump 7.

Figure 4:
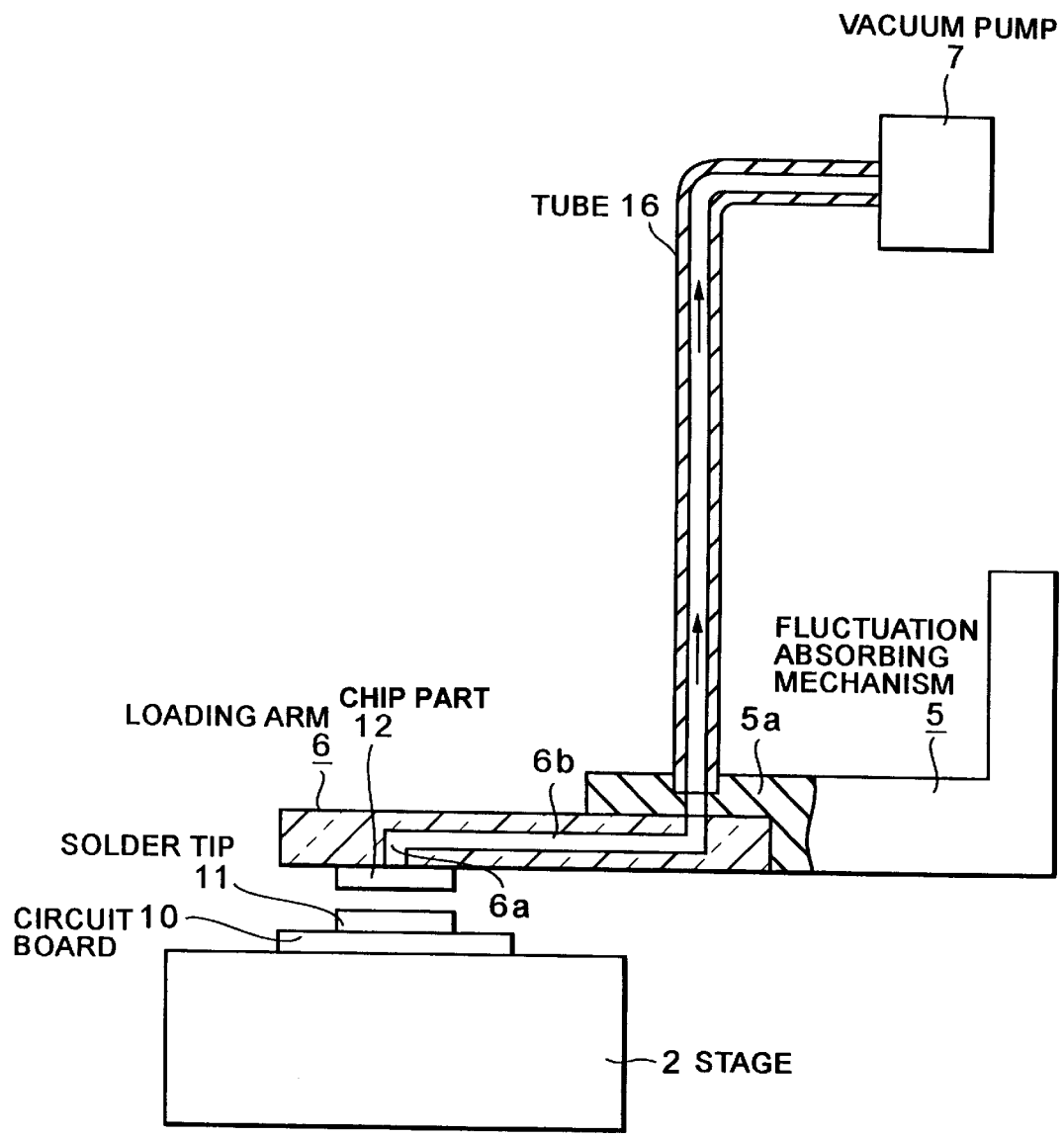
FIG. 4 is a partially broken front view showing an attracting state of a chip part according to the FIG. 1 embodiment.

FIG. 4 is a partially broken front view showing an attracting state of the chip part according to the FIG. 1 embodiment. The loading arm 6 is moved so that the solder tip 11 on the circuit board 10 is positioned just under the chip part 12 attracted to the loading arm 6 so as to face to the chip part 12.

Figure 5:
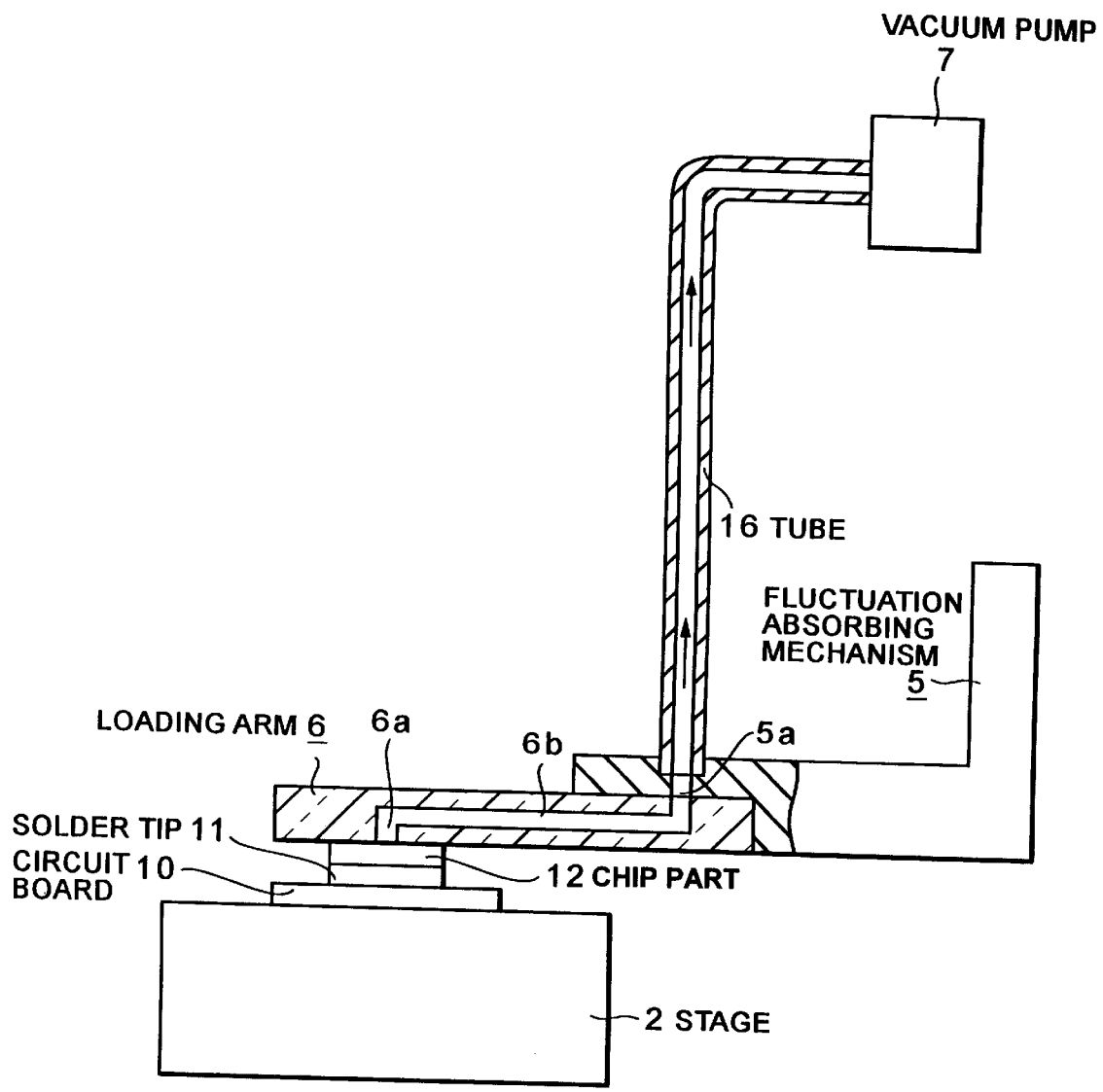
FIG. 5 is a partially broken front view showing a loading state of a chip part according to the FIG. 1 embodiment.

FIG. 5 is a partially broken front view showing a loading state of the chip part according to the FIG. 1 embodiment. The fluctuating mechanism 4 as shown in FIG. 1 is driven to lower the fluctuation absorbing mechanism 5 and the loading arm 6. Thus the chip part 12 is loaded on the solder tip 11.

Pressing of the Parts

Figure 6:
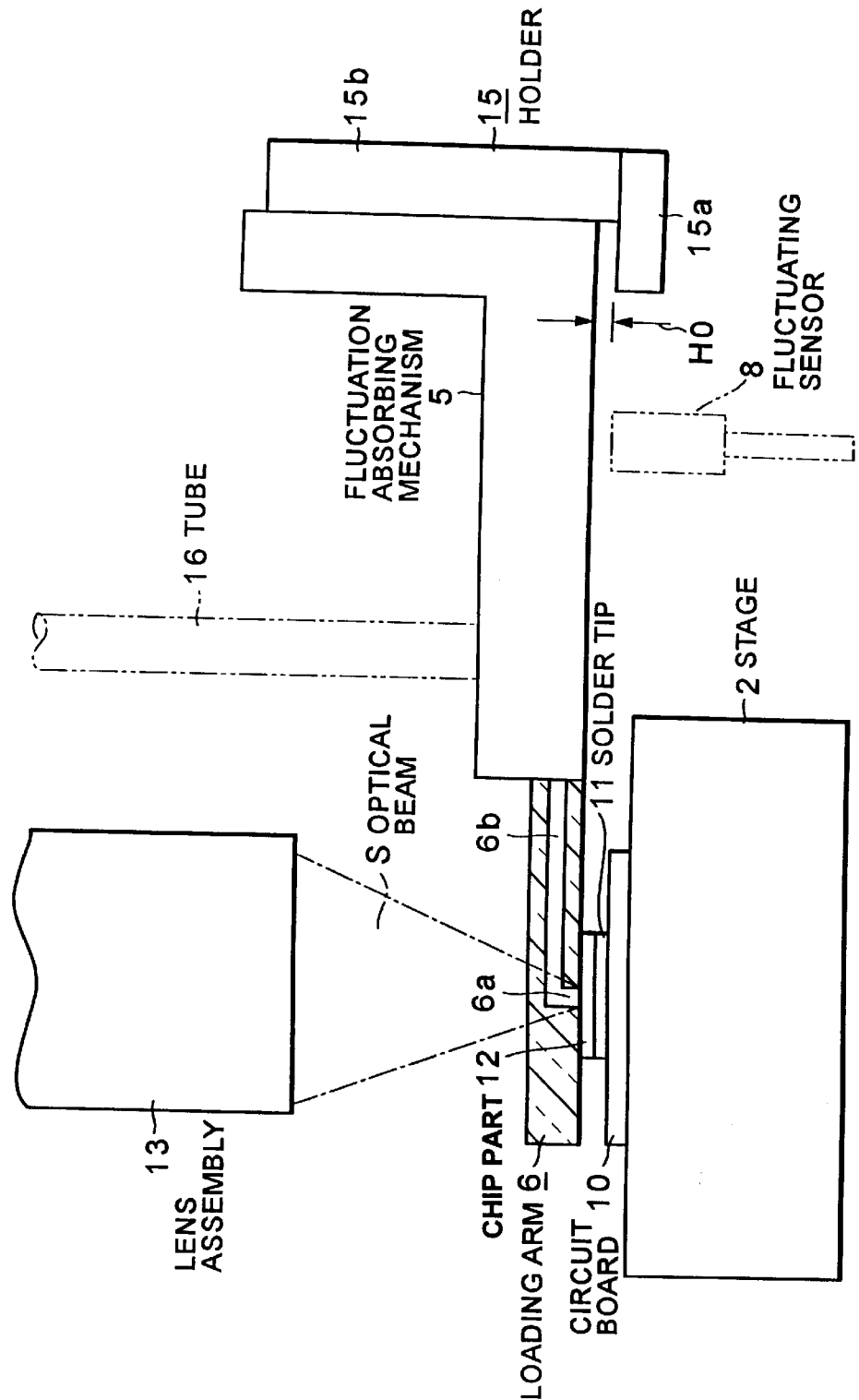
FIG. 6 is a partially broken front view showing a pressing state of a chip part according to the FIG. 1 embodiment.

FIG. 6 is a partially broken front view showing a pressing state of the chip part according to the FIG. 1 embodiment.

The fluctuating mechanism 4 is driven successively to lower the fluctuation absorbing mechanism 5 and the loading arm 6. Thus the chip part 12 is pressed downward on the solder tip 11. This prevents misalignment between the circuit board 10 and the chip part 12.

Also, a driving coil (not shown) is built in the fluctuation absorbing mechanism 5, and only the loading arm 6 disposed on the tip end portion of the fluctuation absorbing mechanism 5 is pressed further downward by an electromagnetic force of the driving coil. Thus the chip part 12 may be pressed toward the circuit board 10.

Although the fluctuating mechanism 4 moves downward at this time, the fluctuation absorbing mechanism 5 is separated from the horizontal portion 15a of the holder 15 as shown in FIG. 6 after the chip part 12 is loaded on the solder tip 11. Therefore, the chip part 12 is prevented from being subjected to a large force other than the downward pressing force due to the gravity of the fluctuation absorbing mechanism 5 and the loading arm 6.

The height difference between the top surface of the horizontal portion 15a of the holder 15 and the bottom surface of the fluctuation absorbing mechanism 5 is defined as an arm height H. The arm height H at this time is equal to H0.

Heating of the Parts

Next, the optical source 3 is turned on, and as shown in FIG. 6, the optical beam S emitted from the optical source 3 is caused to pass through the optical fiber 14, lens assembly 13, and loading arm 6 in succession. The optical beam S is reached onto the surface of the chip part 12. Thus the solder tip 11 is heated by means of the conduction heat from the chip part 12.

Figure 7:
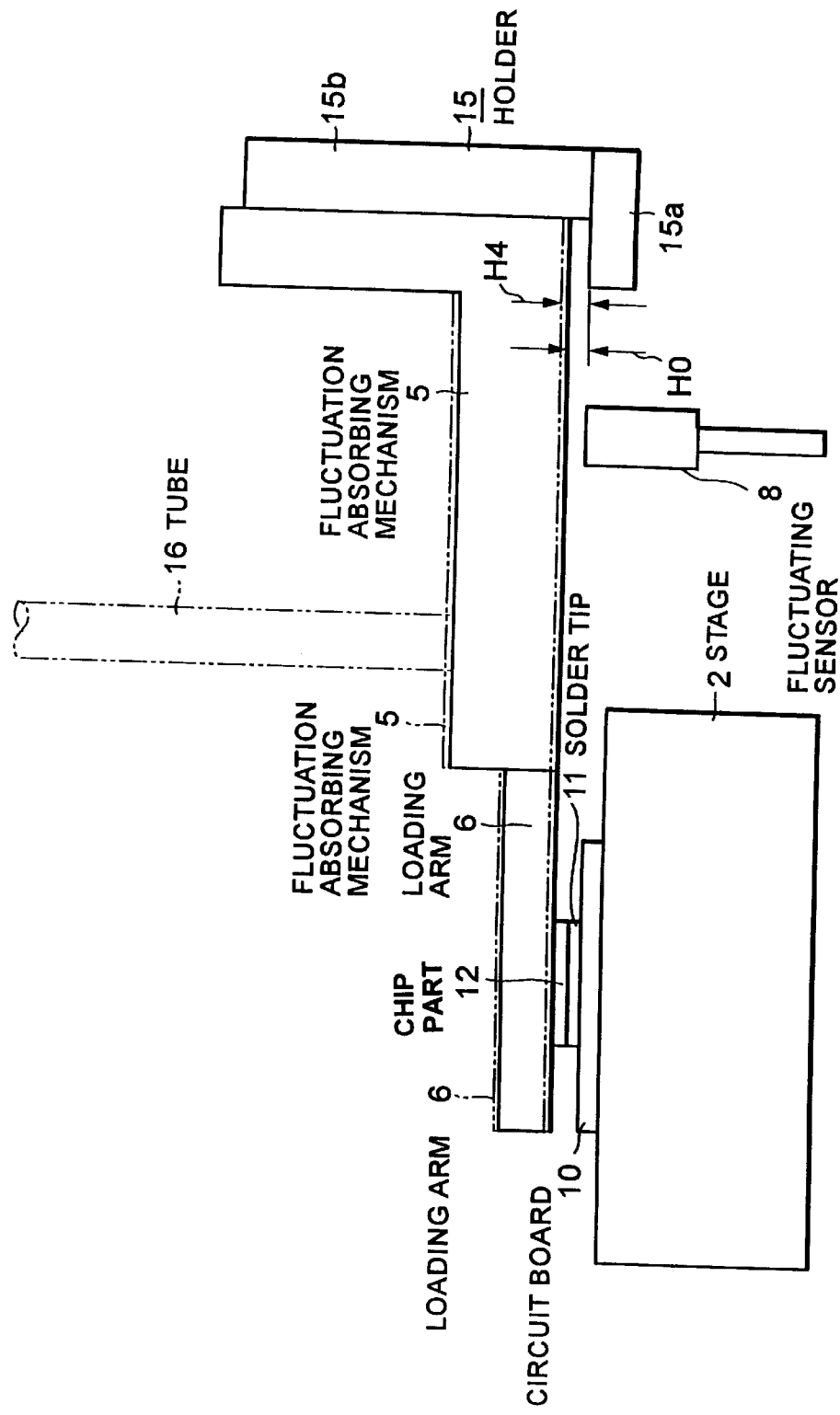
FIG. 7 is a partially broken front view showing a state before melting of a solder tip according to the FIG. 1 embodiment.

FIG. 7 is a partially broken front view showing a state before melting of a solder tip according to the FIG. 1 embodiment. When the temperature of the chip part 12 is raised by the optical beam S emitted from the optical source 3, the temperature of the solder tip 11 is also increased. At this time, as shown in FIG. 7, the circuit board 10, the solder tip 11, and chip part 12 are expanded by the temperature rise, so that the arm height H becomes H4 (>H0).

Melting of the Solder Tip

Figure 8:
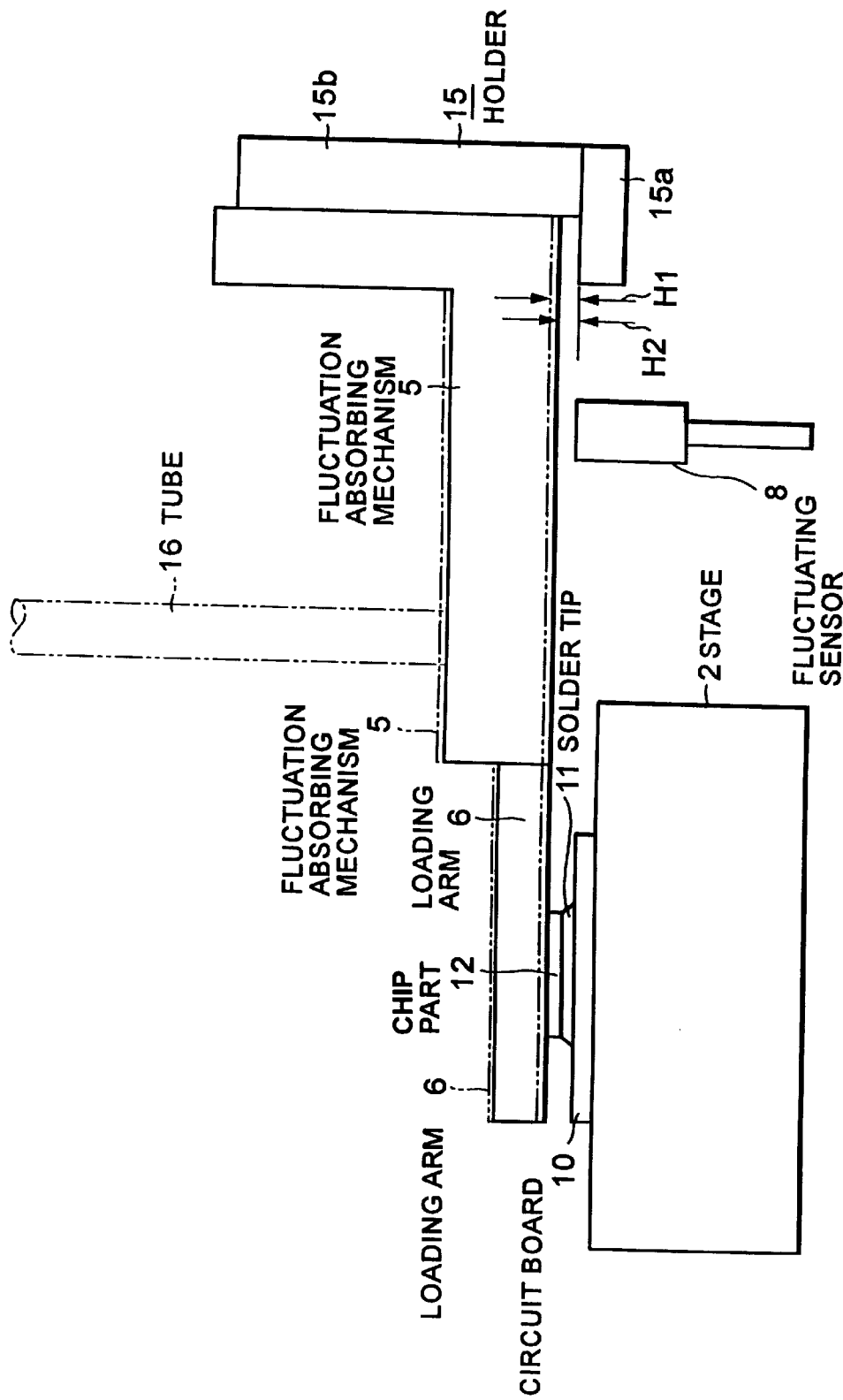
FIG. 8 is a partially broken front view showing a state after melting of a solder tip according to the FIG. 1 embodiment.

FIG. 8 is a partially broken front view showing a state after melting of a solder tip according to the FIG. 1 embodiment. The solder tip 11 reaches the melting temperature and then is melted. Since the heat is absorbed by the melting of the solder tip 11 at this time, thermal expansion of the circuit board 10, solder tip 11, and chip part 12 decreases slightly, so that the arm height H becomes H1 (<H4).

When the solder tip 11 has been melted, the optical source 3 is turned off, and the solder tip 11 is solidified. Thus the chip part 12 is soldered onto the circuit board 10. The arm height H at the time of the solidification of the solder tip 11 is H2 (H0<H2<H1).

As described above, in the parts soldering apparatus in this embodiment, it is necessary only that the chip part 12 having a very low heat capacity be heated by irradiating the optical beam S through the light-transmitting material of the loading arm 6 when the solder tip 11 is melted. Thus the melting time of the solder tip 11 can be shortened significantly.

Also, in this embodiment, the loading arm 6 presses the chip part 12 toward the circuit board 10 even when the solder tip 11 is melted, so that the misalignment of the chip part 12 can be prevented.

Further, in this embodiment, the chip parts 12 are heated individually when being soldered. When a large number of chip parts 12 are mounted on the circuit board 10, therefore, the scrubbing operation of the chip part 12, which has conventionally been necessary to remove an oxide film of the solder tip 11 before the chip part 12 is loaded, becomes unnecessary.

Figure 9:
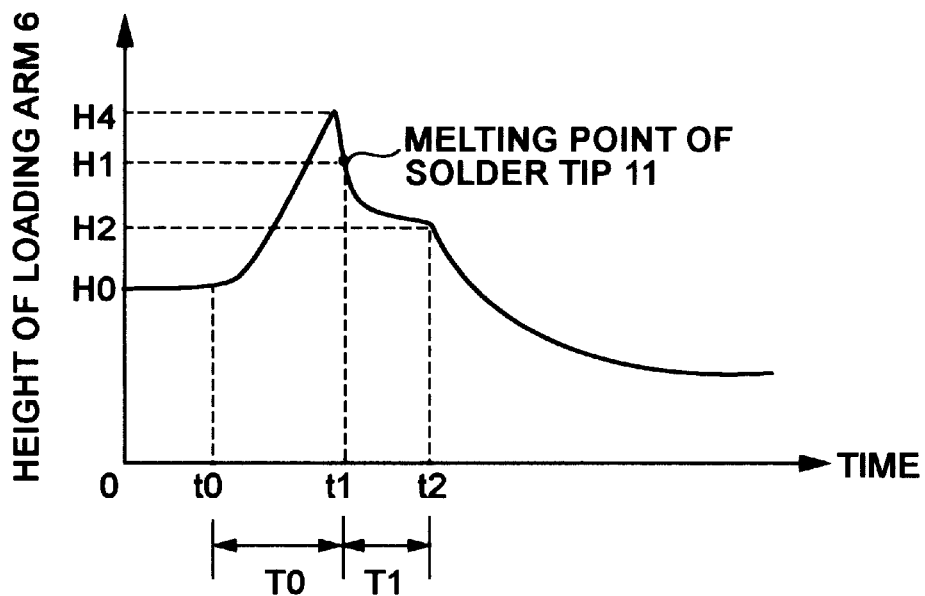
FIG. 9 is an arm height versus time characteristic diagram in a parts soldering method according to the first embodiment of the present invention.
Figure 10:
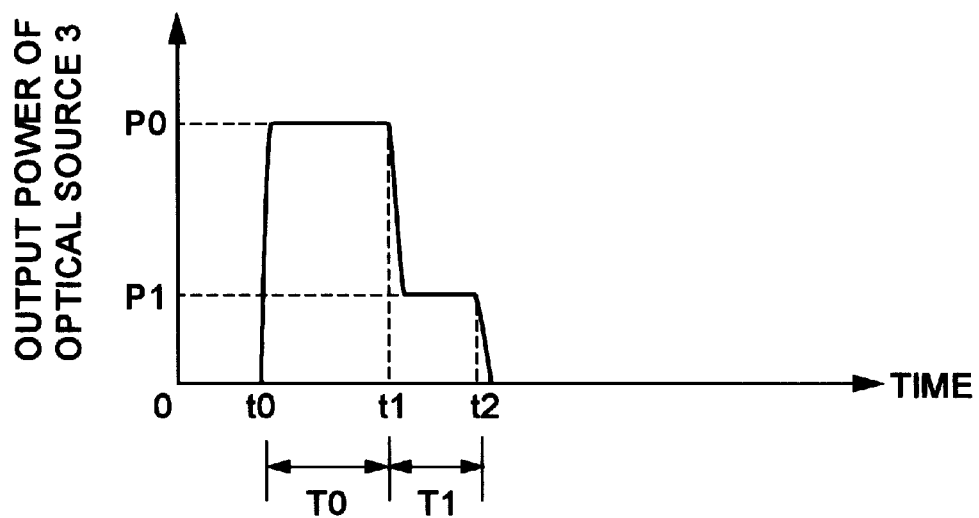
FIG. 10 is an output power versus time characteristic diagram according to the FIG. 9 embodiment.

The following is a description of a parts soldering method in accordance with a first embodiment of the present invention. FIG. 9 is an arm height versus time characteristic diagram in a parts soldering method according to the first embodiment of the present invention. FIG. 10 is an output power versus time characteristic diagram according to the FIG. 9 embodiment.

The output power control of the optical source 3 in the first embodiment of the present invention is carried out through the following processes (1) to (6):

(1) In the controller 9 as shown in FIG. 2, when the height detecting signal Sdt indicates the arm height H=H0 at the time of loading of the chip part 12 as shown in FIG. 9, the optical source controlling circuit 9a outputs the driving signal Sdr, and turns on the optical source 3 at the output power P=P0 as shown in FIG. 10. When the optical source 3 is turned on, the chip part 12 is heatedby the optical beam S.

(2) The temperature of the chip part 12 is gradually increased by the irradiating of the optical beam S, and the circuit board 10, solder tip 11, and chip part 12 are expanded thermally by the temperature rise, so that the loading arm 6 is raised. Therefore, the arm height H becomes H4 (>H0) as shown in FIG. 9.

(3) Since heat is absorbed when the solder tip 11 is melted, thermal expansion is decreased, so that the loading arm 6 is lowered slightly. Therefore, the arm height H becomes H1 (H0<H1<H4) as shown in FIG. 9.

In FIG. 2, the comparing circuit 9b outputs an agreement signal when the arm height H indicated by the height detecting signal Sdt agrees with the arm height Hi set in the setting circuit 9c.

(4) When the agreement signal is supplied, the optical source controlling circuit 9a outputs the driving signal Sdr, and controls the optical source 3 so that the output power P=P1 (<P0) as shown in FIG. 10.

(5) When the solder tip 11 has been melted, the chip part 12 is buried in the melted solder tip 11 by the gravity of the fluctuation absorbing mechanism 5 and the loading arm 6, so that the loading arm 6 is further lowered. Therefore, the arm height H becomes H2 (H0<H2<H1) as shown in FIG. 9.

The comparing circuit 9b as shown in FIG. 2 outputs the agreement signal when the arm height H indicated by the height detecting signal Sdt agrees with the arm height H2 set in the setting circuit 9c.

(6) When the agreement signal is supplied, the optical source controlling circuit 9a stops the driving signal Sdr, and turns off the optical source 3 as shown in FIG. 10.

In this embodiment, therefore, even if the light absorption of the chip part 12 is varied by the contamination etc. of the surface of the chip part 12, or even if the light transmittance of the loading arm 6 is varied by the contamination etc. of the surface of the loading arm 6, the temperature change of the chip part 12 can always be kept constant. Therefore, poor soldering caused by insufficient heating of the solder tip 11 and thermal destruction caused by overheating of the chip part 12 can be prevented.

Figure 11:
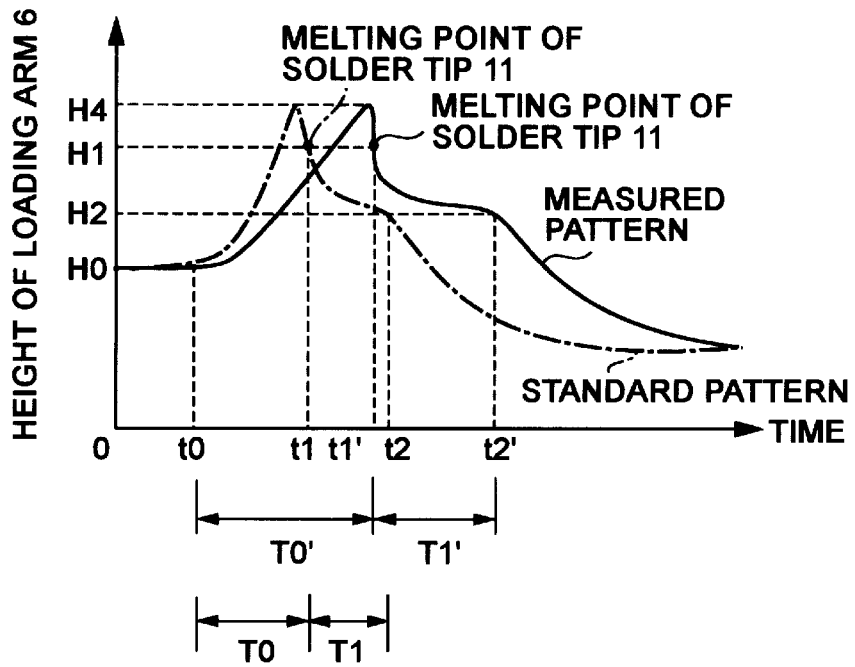
FIG. 11 is an arm height versus time characteristic diagram in a parts soldering method according to the second embodiment of the present invention.
Figure 12:
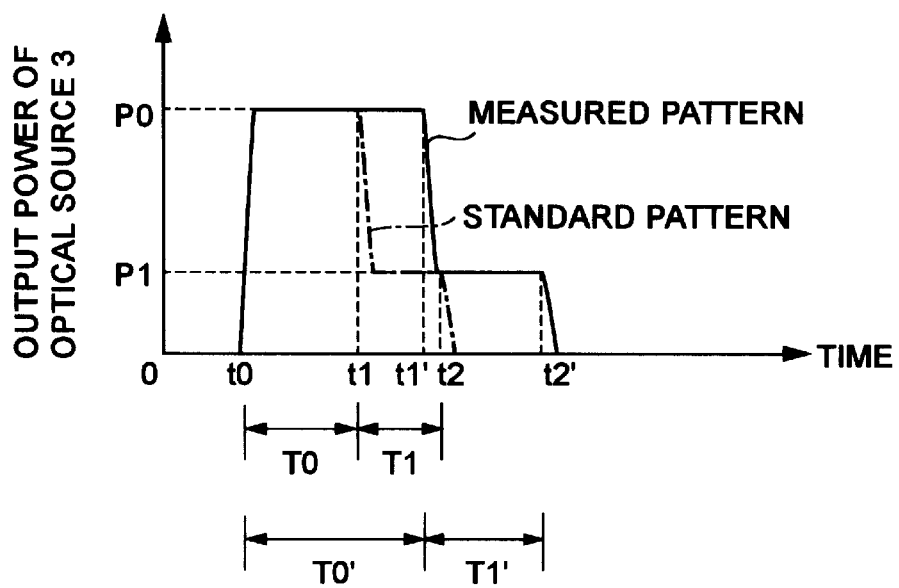
FIG. 12 is an output power versus time characteristic diagram according to the FIG. 11 embodiment.
Figure 13:
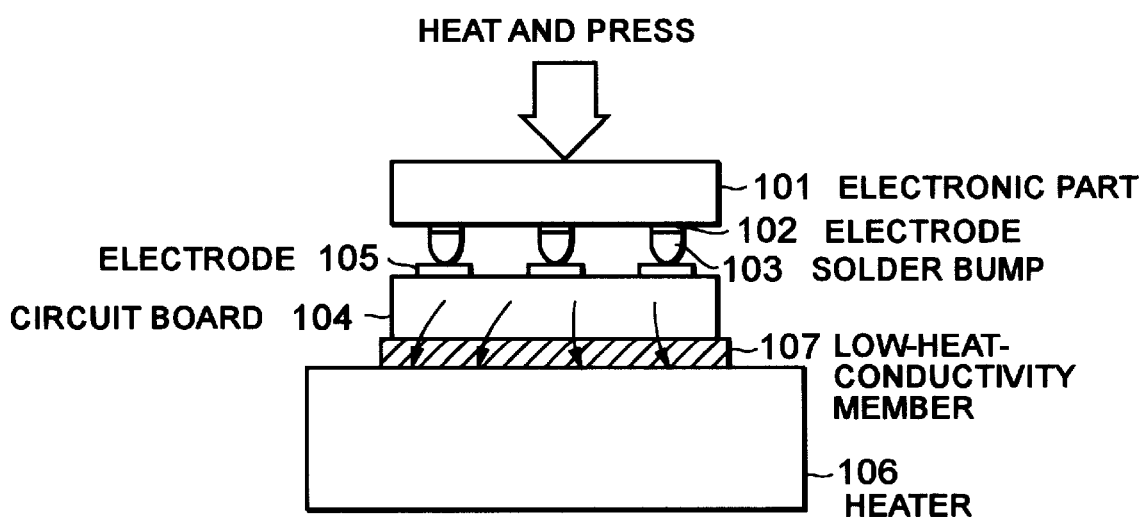
FIG. 13 is a schematic view for illustrating a soldering process in a parts soldering apparatus for semiconductor devices as a prior art.

FIG. 11 is an arm height versus time characteristic diagram in a parts soldering method according to the second embodiment of the present invention. FIG. 12 is an output power versus time characteristic diagram according to the FIG. 11 embodiment. The output power control of the optical source 3 in the this embodiment is carried out through the following processes (1) to (8):

(1) In the controller 9 as shown in FIG. 2, when the arm height H indicated by the height detecting signal Sdt agrees with the arm height H0 at the time of loading of the chip part 12 as shown in FIG. 11, the optical source controlling circuit 9a outputs the driving signal Sdr to turn on the optical source 3 at the output power P=P0 as shown in FIG. 12, and also outputs a signal to the timer 9d.

The optical beam S emitted from the optical source 3 heats the chip part 12, and the timer 9d starts to measure the light irradiation time T0' of the optical source 3 from the time t0 as shown in FIG. 11.

(2) The temperature of the chip part 12 is gradually increased by the irradiating of the optical beam S, and the circuit board 10, solder tip 11, and chip part 12 are expanded thermally by the temperature rise, so that the loading arm 6 is raised. Therefore, the arm height H becomes H4 (>H0) as shown in FIG. 11.

(3) Since heat is absorbed when the solder tip 11 is melted, thermal expansion is decreased, so that the loading arm 6 is lowered slightly. Therefore, the arm height H becomes H1 (H0<H1<H4) as shown in FIG. 11.

The comparing circuit 9b as shown in FIG. 2 outputs an agreement signal when the arm height H indicated by the height detecting signal Sdt agrees with the arm height H1 set in the setting circuit 9c.

(4) When the agreement signal is supplied, the optical source controlling circuit 9a outputs the driving signal Sdr, and controls the optical source 3 so that the output power P=P1 (<P0) as shown in FIG. 12.

(5) The timer 9d as shown in FIG. 2 measures the time t1' when the arm height H becomes H1 and the light irradiation time T0' from the time t0 to the time t1', and supplies the information of the time t1' and the light irradiation time T0' to the operating circuit 9e.

(6) As shown in FIG. 11, it is defined that the light irradiation time before the melting of the solder tip 11, of the standard pattern, stored in advance as T0; the light irradiation time after the melting of the solder tip 11, of the standard pattern, stored in advance as T1; and the light irradiation time before the melting of the solder tip 11, of the measured pattern as T0'. The operating circuit 9e determines the light irradiation time T1' from the formula of T1'=((T1/T0)×T0'), and outputs a signal indicating the light irradiation time T1' to the optical source controlling circuit 9a.

(7) In FIG. 2, when the signal is supplied from the operating circuit 9e, the optical source controlling circuit 9a outputs the driving signal Sdr, and controls the optical source 3 so that the output power P becomes P1 as shown in FIG. 12 for a period of the light irradiation time T1' from the time t1' of melting of the solder tip 11.

(8) When the light irradiation time T1' has elapsed and then the time t2' comes, the optical source controlling circuit 9a stops the driving signal Sdr, and turns off the optical source 3 as shown in FIG. 12.

In this embodiment, therefore, similarly as in the first embodiment, even if the light absorption of the chip part 12 is varied by the contamination etc. of the surface of the chip part 12, or even if the light transmittance of the loading arm 6 is varied by the contamination etc. of the surface of the loading arm 6, the temperature change of the chip part 12 can always be kept constant. Therefore, poor soldering caused by insufficient heating of the solder tip 11 and thermal destruction caused by overheating of the chip part 12 can be prevented.

In the present invention, the material of the loading arm, and the type of the optical source, the fluctuating sensor, and the like are not limited to those in the above-described embodiments.

As described above, according to the present invention, since the loading arm, which loads and presses the part onto the solder tip, allows the optical beam emitted from the optical source to pass through, the part need not be heated after the loading arm is once moved to another position. Therefore, the melting time of solder tip can be shortened, and the productivity of parts soldering process can be enhanced. Also, misalignment of part does not occur when the solder tip is melted, and the mounting accuracy of the part to the circuit board can be increased.

Further, since the parts are heated and soldered individually, there is no need for removing an oxide film of the solder tips by the scrubbing operation of the parts before the parts are loaded, unlike the prior art. Even when a large number of the parts are soldered onto the circuit board, the electrical reliability can be enhanced significantly.

What is claimed is:

1. A parts soldering apparatus comprising:
    a stage for positioning a circuit board thereon, a solder tip being mounted on said circuit board;
    a loading arm comprising a light-transmitting material, for loading a part onto said solder tip;
    a fluctuating mechanism for pressing said loading arm toward said circuit board;
    an optical source for irradiating light onto said part through said loading arm and for melting said solder tip by the conductive heat of said light irradiated onto said part;
    a fluctuating sensor for outputting a height detecting signal according to a height of said loading arm; and
    a controller for controlling an output power of said optical source in response to said height detecting signal from said fluctuating sensor.

2. The parts soldering apparatus as defined in claim 1, wherein said controller turns on said optical source at a first output power during a time when said loading arm moves from a height at a time of loading of said part onto said solder tip to a height at a time of melting of said solder tip,
    wherein said controller turns on said optical source at a second output power lower than said first output power during the time when said loading arm moves from the height at the time of melting of said solder tip to the height at a time of said solder tip being solidified, and
    wherein said controller turns off said optical source after said loading arm has moved to the height at when said solder tip has been solidified.

3. The parts soldering apparatus as defined in claim 1, wherein said stage incorporates a heater for preheating said circuit board on said stage.

4. The parts soldering apparatus as defined in claim 1, further comprising a vacuum pump communicating with a bottom surface of said loading arm, for attracting said part to the bottom surface of said loading arm.

5. The parts soldering apparatus as defined in claims 1, further comprising a fluctuation absorbing mechanism disposed between said loading arm and said fluctuating mechanism, for absorbing the fluctuation of movement of said loading arm.

6. A parts soldering method comprising:
    positioning a circuit board on a stage, said circuit board having a solder tip mounted thereon;
    loading a part onto said solder tip by a loading arm comprising a light-transmitting material; and
    irradiating light onto said part through said loading arm by pressing said part toward said circuit board by said loading arm and melting said solder tip by the conductive heat of said light irradiated onto said part,
        wherein said optical source is turned on at a first output power during a time when said loading arm moves from a height at a time of loading of said part onto said solder tip to a height at a time of melting of said solder tip,
        wherein said optical source is turned on at a second output power lower than said first output power during a time when said loading arm moves from the height at the time of melting of said solder tip to the height at a time said solder tip is solidified, and
        wherein said optical source is turned off after said loading arm has moved to the height of said solder tip being solidified.

* * * * *